(12) United States Patent
Yang

(10) Patent No.: US 11,393,720 B2
(45) Date of Patent: Jul. 19, 2022

(54) DIE CORNER PROTECTION BY USING POLYMER DEPOSITION TECHNOLOGY

(71) Applicant: Micron Technology, Inc., Boise, ID (US)

(72) Inventor: Po Chih Yang, Taichung (TW)

(73) Assignee: Micron Technology, Inc., Boise, ID (US)

( * ) Notice: Subject to any disclaimer, the term of this patent is extended or adjusted under 35 U.S.C. 154(b) by 130 days.

(21) Appl. No.: 16/901,485

(22) Filed: Jun. 15, 2020

(65) Prior Publication Data
US 2021/0391216 A1 Dec. 16, 2021

(51) Int. Cl.
| | |
|---|---|
| *H01L 21/78* | (2006.01) |
| *H01L 21/02* | (2006.01) |
| *H01L 21/3065* | (2006.01) |
| *H01L 21/268* | (2006.01) |
| *H01L 21/304* | (2006.01) |

(52) U.S. Cl.
CPC .......... *H01L 21/78* (2013.01); *H01L 21/0212* (2013.01); *H01L 21/0217* (2013.01); *H01L 21/268* (2013.01); *H01L 21/304* (2013.01); *H01L 21/3065* (2013.01)

(58) Field of Classification Search
CPC . H01L 21/78; H01L 21/0212; H01L 21/0217; H01L 21/268; H01L 21/304; H01L 21/3065; H01L 41/338; H01L 21/6836; H01L 2221/68327
See application file for complete search history.

(56) References Cited

U.S. PATENT DOCUMENTS

| | | | | |
|---|---|---|---|---|
| 2008/0265441 | A1* | 10/2008 | Okada | H01L 24/97 438/118 |
| 2015/0235845 | A1* | 8/2015 | Sekita | H01L 23/3114 438/667 |
| 2018/0158713 | A1* | 6/2018 | Okita | H01J 37/32715 |
| 2020/0020585 | A1* | 1/2020 | Wakahara | H01L 33/0095 |
| 2020/0312781 | A1* | 10/2020 | Signorini | H01L 21/4857 |

* cited by examiner

*Primary Examiner* — Thanh T Nguyen
(74) *Attorney, Agent, or Firm* — Perkins Coie LLP

(57) ABSTRACT

A method for separating semiconductor dies of a semiconductor die assembly comprises depositing a first coating on a first surface of the assembly. The assembly comprises a die wafer having a plurality of semiconductor dies and first and second surfaces. A first portion of the die wafer and the first coating is removed between adjacent semiconductor dies to form trenches having an intermediate depth in the die wafer between first and second surfaces such that die corners are formed on either side of the trenches. A protective coating is deposited on the first surface of the die assembly to cover the die corners, trenches and at least a portion of the first coating. The first coating is selectively removed such that portions of the protective coating covering die corners and trenches remain on the die wafer. Adjacent semiconductor dies are separated and the protective coating remains covering the die corners.

16 Claims, 5 Drawing Sheets

DIE CORNER PROTECTION BY USING POLYMER DEPOSITION TECHNOLOGY

TECHNICAL FIELD

The present technology is directed to semiconductor manufacturing. More particularly, some embodiments of the present technology relate to techniques for protecting corners, edges, and/or sidewalls of the dies during separation and other manufacturing processes.

BACKGROUND

Semiconductor dies are typically manufactured by arranging a plurality of dies in a grid pattern on a device wafer that has one or more layers. The dies are then separated from each other. The separation process can be accomplished with plasma dicing, laser ablation, or a rotary blade, for example. Damage to the dies such as cracking along the die corners and edges, as well as delamination of layers, can be caused during the separation process and other manufacturing steps, such as back-grinding of the device wafer. The physical damage sustained by the dies can lower their reliability and yield.

BRIEF DESCRIPTION OF THE DRAWINGS

Many aspects of the present technology can be better understood with reference to the following drawings. The components in the drawings are not necessarily to scale. Instead, emphasis is placed on illustrating the principles of the present technology.

DETAILED DESCRIPTION

Specific details of several embodiments for protecting corners and/or sidewalls of semiconductor dies during manufacturing are described below. In one example, a first coating can be applied over the die assembly before cutting a trench between adjacent dies. A protective coating can then be applied over the die assembly before separating the dies. The protective coating adheres to and protects the die corners (e.g., corners and edges) from cracking during the separation process. Additionally, the protective coating can protect at least a portion of the layers of the die to help prevent delamination. In other embodiments, the first coating can be applied over the die assembly before performing a half-cut or other process to remove material from between adjacent dies. The protective coating can be applied over the die assembly after the half-cut process. The protective coating adheres to and protects the die corners as well as the sidewalls of the die. Therefore, the die corners are protected from cracking and the sidewalls are also protected to help prevent delamination of the layers. As a result, the reliability and yield of the semiconductor dies are improved.

FIGS. 1A-2B illustrate an overview of the present technology, while FIGS. 3A-4F illustrate further details of the present technology. Like reference numbers relate to similar components and features in FIGS. 1A-4F. The present technology addresses the technical problem of die corners that can be damaged during the dicing, separating and/or assembly processes. Physical damage to the die corners can cause cracking (e.g. separating or delamination) that can extend into the die material. The cracking can increase electrical and/or functional failure of the die when mounted on a printed circuit board, effectively reducing the expected yield.

Figure 1A:
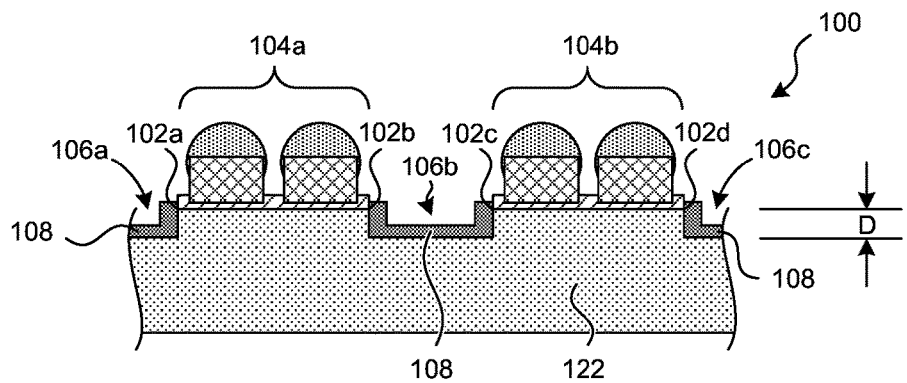
FIG. 1A is a cross-sectional view of two adjacent dies of a semiconductor die assembly with a protective coating deposited on corners of the dies before being separated in accordance with the present technology.

FIG. 1A is a cross-sectional view of two adjacent dies 104a, 104b (collectively "dies 104") of a semiconductor die assembly 100 before being separated in accordance with the present technology. The dies 104 are formed within a die wafer 122 and trenches 106 (indicated individually as 106a-c) having an intermediate depth "D" are formed by removing material of the die wafer 122 between adjacent dies 104. For example, trench 106b is formed between dies 104a, 104b. The trenches 106 can be formed using, e.g., wet etching, plasma etching, plasma dicing, laser grooving and/or laser dicing. The trenches 106 form die corners 102 (identified individually as 102a, 102b, 102c and 102d) on either side of the dies 104. After forming the trenches 106 to the intermediate depth D, a protective coating 108 (shown in dark gray dots) is applied to protect the die corners 102 before the dies 104 are separated.

Although only two dies 104 are illustrated, the semiconductor die assembly 100 can include many more semiconductor dies 104 arranged in a grid pattern. Each of the dies 104 can be substantially square and/or rectangular in shape. Therefore, as used herein the term "die corner" can include a portion of an edge or an entire edge of the semiconductor die 104 that may extend between two outer corners of the die 104. Accordingly, each semiconductor die 104 can have four die corners 102 that can include the entire lengths or only a portion of the lengths of all four die edges.

Figure 1B:
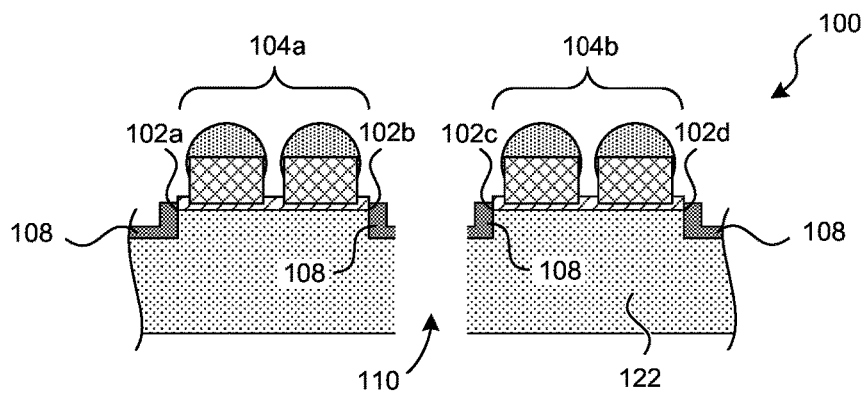
FIG. 1B is a cross-sectional view of the two adjacent dies of the semiconductor die assembly of FIG. 1A that have been separated in accordance with the present technology.

FIG. 1B is a cross-sectional view of the two adjacent dies 104a, 104b of the semiconductor die assembly 100 of FIG. 1A that have been separated in accordance with the present technology. The dies 104 can be separated from each other in this stage of the process using a rotary saw that forms a kerf 110 that is less than the width of the trenches 106. In other embodiments, plasma dicing, laser dicing or other die separation technologies can be used to remove desired portions of the die wafer 122 from between the adjacent dies 104. The protective coating 108 remains intact on and adhered to the die corners 102 after the dies 104 are separated.

In some embodiments, plasma dicing can dice the die wafer 122 with plasma gases that use ion bombardment with a chemical reactive. For example, oxide etching by carbon-fluorine (C—F) based chemistries, silicon etching by fluorine (F) based chemistries, or other appropriate materials and techniques can be used. In other embodiments, a Bosch process of cycling steps of etching and polymer deposition (e.g., deposition of the protective coating 108) can be used.

Figure 2A:
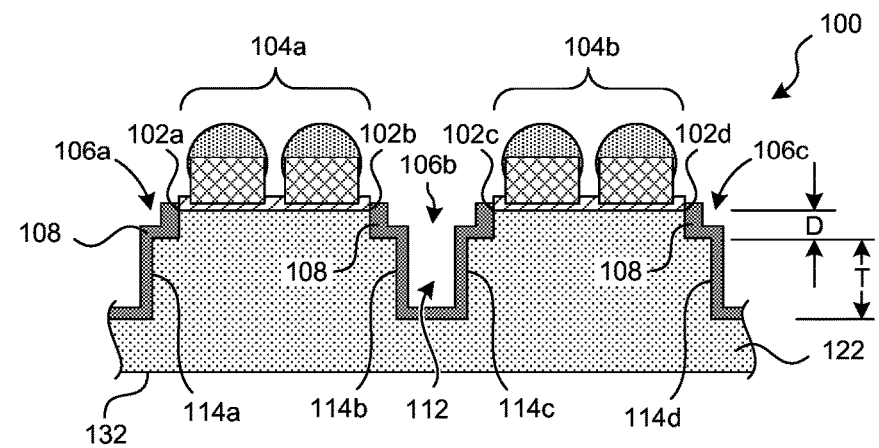
FIG. 2A shows another cross-sectional view of two adjacent dies of a semiconductor die assembly with a protective coating deposited on corners and sidewalls of the dies before being separated in accordance with the present technology.

FIG. 2A shows another cross-sectional view of the two adjacent dies 104a, 104b of the semiconductor die assembly 100 at a stage of an alternative manufacturing process in accordance with the present technology. In this process, trenches 106 are formed at an intermediate depth D between the dies 104 as described above and then channels 112 are formed from the intermediate depth D to a second depth "T." The depth T can be a second intermediate depth in the die wafer 122 as shown in FIG. 2A or it can be completely through the die wafer 122. The depth "T" can be greater than or approximately equal to a desired thickness of the final product. The channels 112 form sidewalls 114 (indicated individually as 114a, 114b, 114c and 114d) of the dies 104 that are spaced apart from each other by a distance that is less than the width of the trenches 106. The channels 112 can be formed using a rotary saw, laser, etching, or other suitable technique. After forming the trench 106 and channel 112, a protective coating 108 is applied over the die assembly 100 to conform to the die corners 102 and sidewalls 114.

Figure 2B:
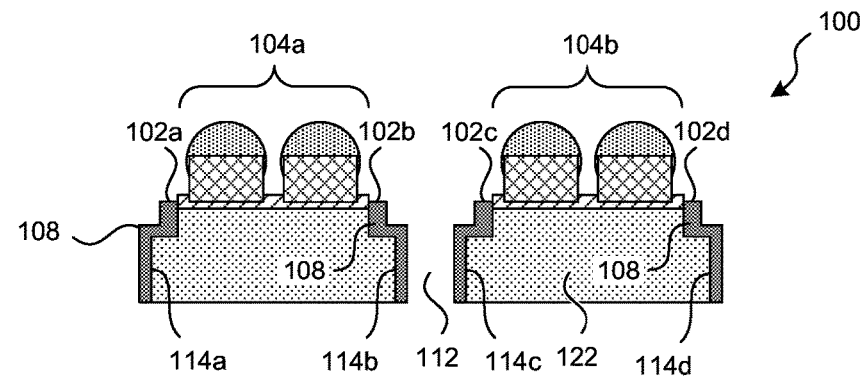
FIG. 2B is a cross-sectional view of the two adjacent dies of the die assembly of FIG. 2A after being separated in accordance with the present technology.

FIG. 2B is a cross-sectional view of the semiconductor die assembly 100 of FIG. 2A after the die wafer 122 has been thinned to separate the dies 104 in accordance with the present technology. The die wafer 122 can be thinned from the bottom side, such as by back-grinding, until the channels 112 are exposed to separate the dies 104. The protective coating 108 remains intact on the die corners 102 and the sidewalls 114 of the dies 104 during the thinning process to further protect the dies 104.

The protective coating 108 and method of applying it provides advantages and benefits such as protection of the die corners 102 and/or sidewalls, which is expected to prevent cracking due to physical damage. The protective coating 108 can improve process yield, electrical function test yield, increase reliability, enhance die strength and provide low-K layer protection. The protective coating 108 can protect the die corners 102 and/or sidewalls 114 during any movement and/or processing of the dies 104, such as process transportation, die pick-up, and die bond.

FIGS. 3A-3G are sequential cross-sectional views of processing the semiconductor die assembly 100 shown in FIGS. 1A and 1B in accordance with the present technology. The method described with respect to FIGS. 3A-3G is expected to protect the die corners 102 from cracking and prevent or inhibit one or more layers of the dies 104 from delamination during the separation process as well as during subsequent steps, as discussed above. The method includes applying two different coatings and processing the semiconductor die assembly 100 such that one of the coatings remains adhered to the die corners 102 of the dies 104 after separation.

Figure 3A:
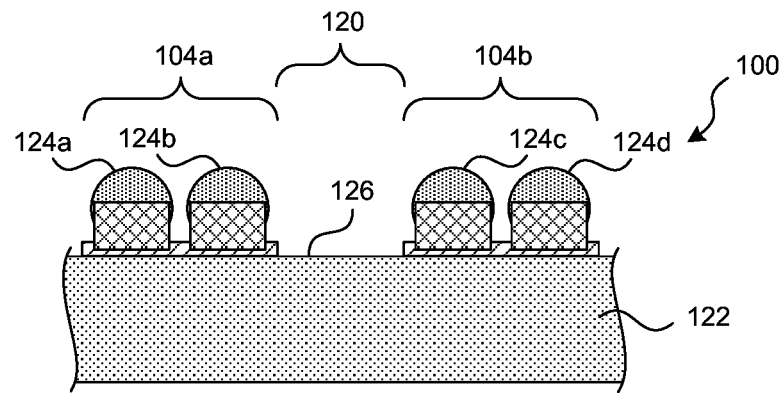
FIG. 3A is a cross-sectional view of a semiconductor die assembly showing two semiconductor dies before separation in accordance with the present technology.

FIG. 3A is a cross-sectional view of the semiconductor die assembly 100 showing the adjacent semiconductor dies 104 before separation in accordance with the present technology. Although only two dies 104 are shown, in practice there are generally many more dies 104 arranged in a grid pattern and separated by lanes 120. One lane 120 is indicated between the dies 104a, 104b. The die assembly 100 can include the die wafer 122 made of a semiconductor material, such as silicon, and integrated circuitry formed on/in the silicon. Each die 104 has conductive pillars or bumps 124 (identified individually as bumps 124a, 124b, 124c and 124d) adhered to bond pads at an active surface 126 of the wafer 122. In some embodiments, the bumps 124 may be solder bumps or may be made of copper or other conductive materials. The die wafer 122 has a first surface that the bumps 124 can be adhered to and a second surface that is opposite to the first surface.

Figure 3B:
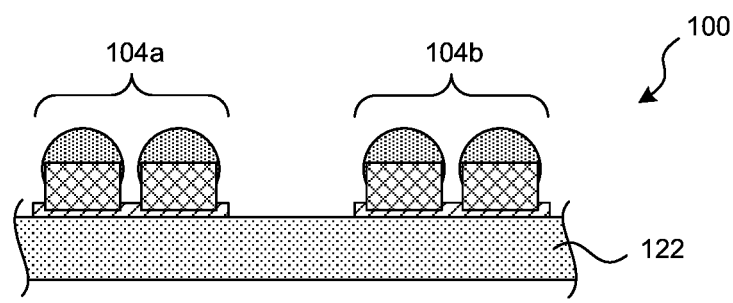
FIG. 3B is a cross-sectional view of the semiconductor die assembly of FIG. 3A after the die wafer has been thinned in accordance with the present technology.

FIG. 3B is a cross-sectional view of the semiconductor die assembly 100 after the die wafer 122 has been thinned. For example, the die wafer 122 can be thinned by back-grinding. In some embodiments, the die wafer 122 can be thinned based on a desired thickness of the finished die 104. Additionally, the die wafer 122 can be processed using laser marking at this step.

Figure 3C:
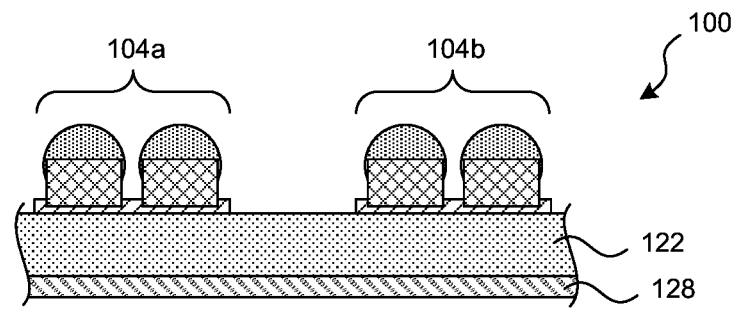
FIG. 3C is a cross-sectional view of the semiconductor die assembly of FIG. 3B mounted to a device wafer in accordance with the present technology.

FIG. 3C is a cross-sectional view of the semiconductor die assembly 100 after the die wafer 122 has been mounted to a device wafer 128. In some embodiments, the device wafer 128 can be silicon. Although not shown, an adhesive is generally applied between the die wafer 122 and the device wafer 128. In operation, the device wafer 128 supports the dies 104 during the separation process.

Figure 3D:
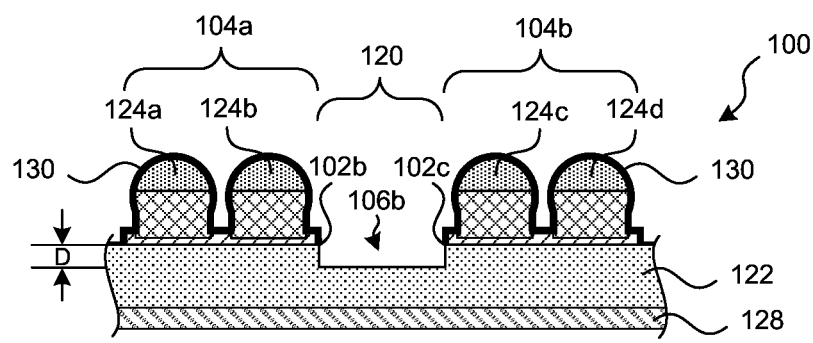
FIG. 3D is a cross-sectional view of the semiconductor die assembly of FIG. 3C after applying a first coating and forming a trench between adjacent dies in accordance with the present technology.

FIG. 3D is a cross-sectional view of the semiconductor die assembly 100 after a first coating 130 has been applied and then the trench 106b has been formed. The first coating 130 (shown in black) is deposited or applied over an outer surface of the die assembly 100 to conform to the contour of the features, including the surfaces of the bumps 124 and the lanes 120. The first coating 130 creates a mask over the die assembly 100, and in some embodiments can be called a common coating. The first coating 130 can be water-soluble and is applied to protect the bumps 124 and the overall top surface of the die assembly 100 against dust and debris during the laser/plasma process and/or other separation or manufacturing processes.

After depositing the first coating 130, the trenches 106 can be formed by removing material from between adjacent dies 104 (e.g., from the top or first surface of the die wafer 122). Processes such as plasma dicing, $SF_6$ isotropic etching, and laser grooving may be used for this stage of the process. The process of forming the trenches 106 first removes the first coating 130 in areas of the lanes 120 and then removes the material of the die wafer 122 to the intermediate depth D between the first and second surfaces of the die wafer 122. The die corners 102 are formed on opposing sides of the trenches 106 and are substantially free of the first coating 130. As previously discussed in FIGS. 1A-1B, several trenches 106 are also formed (although not shown) at the same time to form and expose the die corners 102 on outer sides of the dies 104 on the die wafer 122.

Figure 3E:
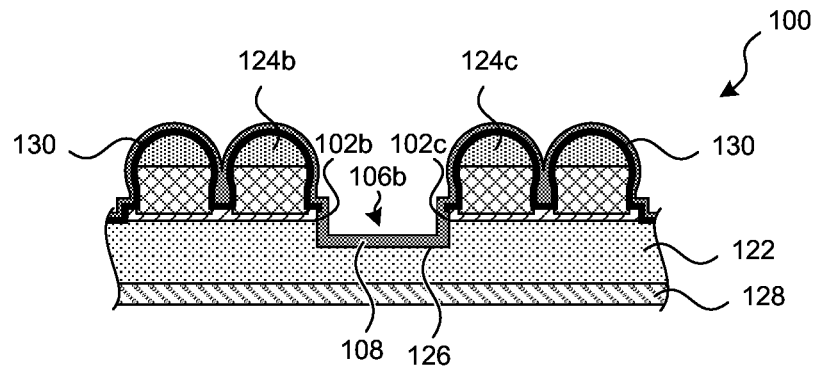
FIG. 3E is a cross-sectional view of the semiconductor die assembly of FIG. 3D after depositing a protective coating in accordance with the present technology.

FIG. 3E is a cross-sectional view of the semiconductor die assembly 100 after the protective coating 108 has been deposited. The protective coating 108 is applied or deposited over at least portions of the outer surface of the die assembly 100, and especially the die corners 102. In some embodiments, the protective coating 108 is applied or deposited over the die corners 102 and at least portions of the bumps 124 and the trench 106. Therefore, the protective coating 108 can be deposited over the first coating 130 that covers the bumps 124 and any other areas on the surface 126 of the die wafer 122. The protective coating 108 can be applied by the same tool used for plasma dicing. In still other embodiments, the protective coating 108 can be deposited using a molded process, such as an epoxy molded process.

The protective coating 108 can be a deposition of a polymer material, such as carbonfluorine ($C_4F_8$) or silicon nitride (SiN). Other materials can be used as long as the material is not removed by the same removal process as the first coating 130. Additionally, the polymer material that is selected is compatible with any underfill or other materials used in the die wafer 122. The polymer material is also compatible with subsequent processing steps as the protective coating 108 remains adhered to the die corners 102.

Figure 3F:
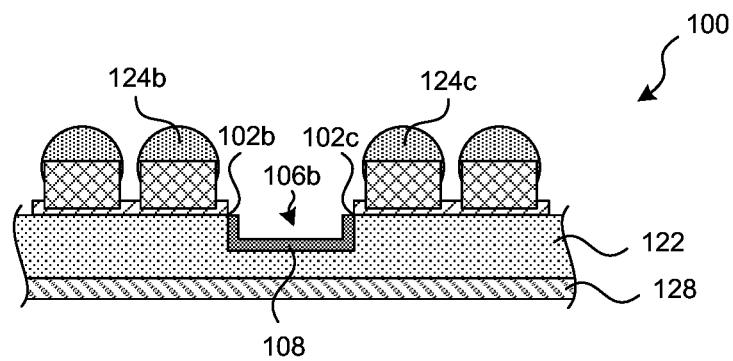
FIG. 3F is a cross-sectional view of the semiconductor die assembly of FIG. 3E with the first coating removed and the protective coating adhered to corners of the dies in accordance with the present technology.

FIG. 3F is a cross-sectional view of the semiconductor die assembly 100 after the first coating 130 has been removed in accordance with the present technology. In some embodiments, the first coating 130 is soluble in a solution (e.g., water) that does not dissolve the protective coating 108. The water can get under the protective coating 108 and dissolve the first coating 130. The portion of the protective coating 108 in the trenches 106 and at the die corners 102 adheres to the silicon or other material of the die wafer 122. Therefore, in areas where the protective coating 108 is on the first coating 130, such as over the bumps 124, selectively dissolving the first coating 130 is expected to cause these portions of the protective coating 108 to be removed during the washing process. The protective coating 108 in the lanes 120, however, remains attached to the die corners 102 and on the surface of the trenches 106. In other embodiments, other appropriate processes can be used to remove the first coating 130, as long as the protective coating 108 remains adhered to the die corners 102 and the surface of the trench 106.

Figure 3G:
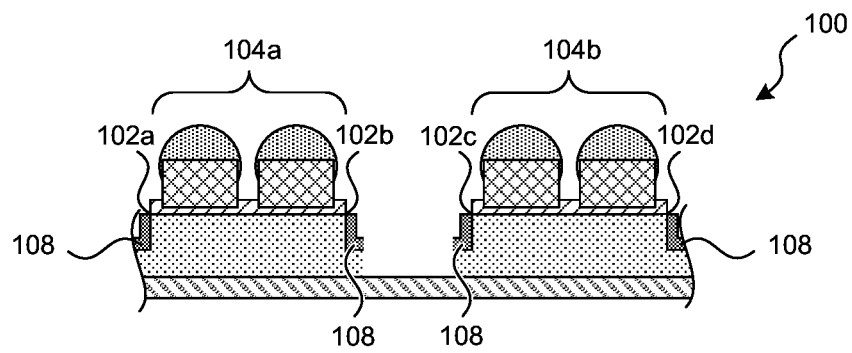
FIG. 3G is a cross-sectional view of the semiconductor die assembly of FIG. 3F after die separation with the protective coating adhered to corners of the dies in accordance with the present technology.

FIG. 3G is a cross-sectional view of the semiconductor die assembly 100 after the dies 104 have been separated from each other in accordance with the present technology. In some embodiments, the dies 104 are separated using plasma dicing techniques, such as $SF_6$ isotropic etching, or laser dicing processes (e.g., laser ablation). In some cases, the plasma dicing and the application of the protective coating 108 can be accomplished within the same chamber. Therefore, the semiconductor die assembly 100 may remain in the chamber after the protective coating 108 is applied. Accordingly, an expected advantage is that handling and transportation of the semiconductor die assembly 100 is minimized. The protective coating 108 remains on the die corners 102 as the dies 104 are separated from each other. One expected advantage of the embodiment shown in FIGS. 3F and 3G is that the protective coating 108 protects the die corners 102 from cracking during separation and any post laser ablation process, such as during process transportation. For example, the die corners 102 can be exposed to potential physical damage during multiple steps of the manufacturing process, such as during dicing, die pick-up and die bonding. The protective coating 108 also protects metal structures at the active surface of the die wafer 122 from delamination during the same manufacturing steps.

FIGS. 4A-4F are sequential cross-sectional views of processing the semiconductor die assembly 100 shown in FIGS. 2A and 2B in accordance with the present technology. The method described with respect to FIG. 4A-4F is expected to protect the die corners 102 and layers of the dies 104 as discussed above. The method includes applying two different coatings and processing the die assembly 100 such that one of the coatings remains adhered to the die corners 102 and sidewalls 114 of the dies 104 after the dies 104 are separated.

Figure 4A:
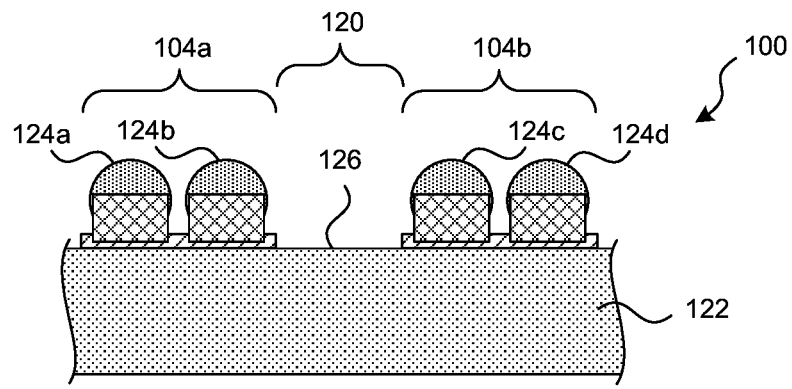
FIG. 4A is a cross-sectional view of a semiconductor die assembly showing two semiconductor dies before separation in accordance with the present technology.

FIG. 4A is a cross-sectional view of the semiconductor die assembly 100 showing the adjacent dies 104 before separation. As discussed above with FIG. 3A, many dies 104 can be arranged in a grid pattern and separated by the lanes 120. Each die 104 has bumps 124 adhered to the active surface 126 of the wafer 122.

Figure 4B:
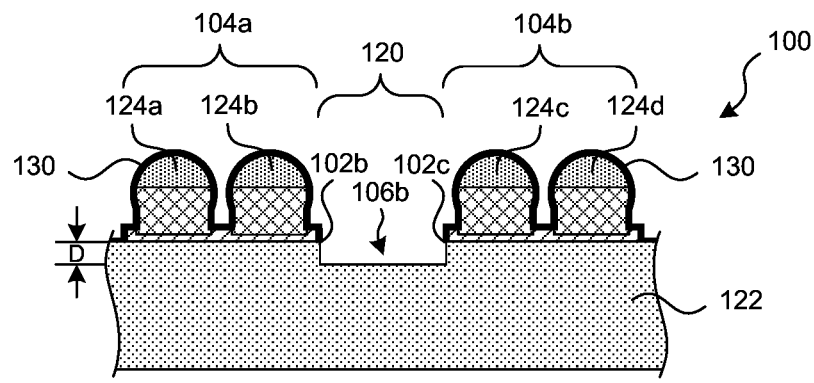
FIG. 4B is a cross-sectional view of the semiconductor die assembly of FIG. 4A after applying the first coating and forming a trench between adjacent dies in accordance with the present technology.

FIG. 4B is a cross-sectional view of the semiconductor die assembly 100 after the first coating 130 has been applied and then the trench 106b has been formed, such as by laser grooving. The first coating 130 (shown in black) can be a mask applied over the active surface 126 of the die assembly 100 to conform to the contour of the features, including the surfaces of the bumps 124 and the lanes 120. After depositing the first coating 130, the trenches 106 can be formed by first removing the first coating 130 in areas of the lanes 120. Material of the die wafer 122 can then be removed to the intermediate depth D, such as by the laser grooving. Although not shown in FIG. 4B, the trenches 106a and 106c (shown in FIG. 2A) are also formed by removing material between adjacent dies 104, and the die corners 102 are formed on outer sides of the dies 104a, 104b.

Figure 4C:
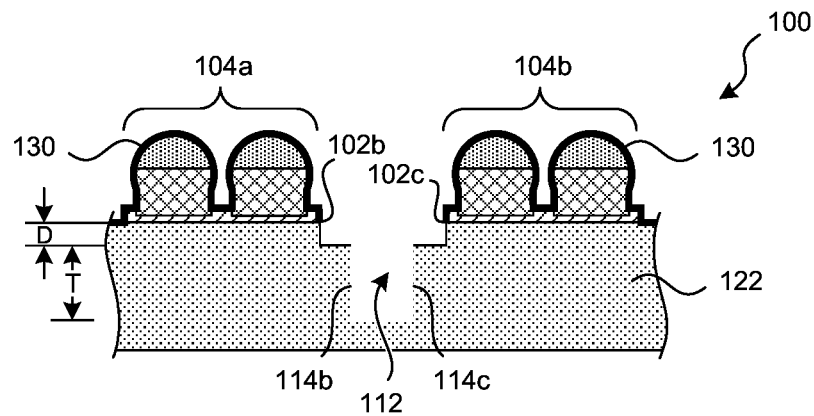
FIG. 4C shows a cross-sectional view of the semiconductor die assembly of FIG. 4B after additional material of the die wafer is removed from between the adjacent dies in accordance with the present technology.

FIG. 4C shows a cross-sectional view of the semiconductor die assembly 100 after the channels 112 are formed at a second depth "T". The depth "T" can be a second intermediate depth in the die wafer 122, which can be greater than or approximately equal to a desired thickness of the final product. The channels 112 form the sidewalls 114 that are spaced apart from each other by a distance that is less than the width of the trenches 106. The channels 112 can be formed using a rotary saw, laser, etching or other suitable technique.

Figure 4D:
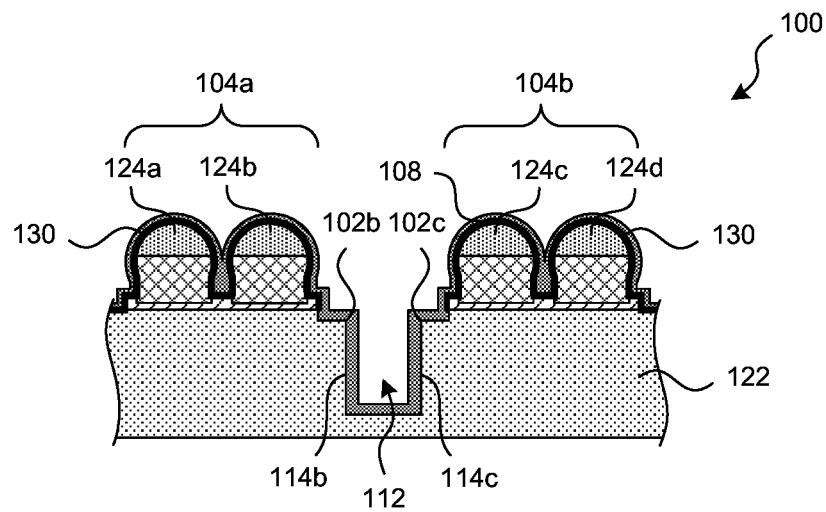
FIG. 4D is a cross-sectional view of the semiconductor die assembly of FIG. 4C with the protective coating deposited in accordance with the present technology.

FIG. 4D is a cross-sectional view of the semiconductor die assembly 100 after the protective coating 108 has been deposited in accordance with the present technology. The protective coating 108 can be deposited on the die corners 102 and sidewalls 114 of the channels 112, as well as over the contours of the bumps 124 and other outer surface areas of the die assembly 100. Therefore, the protective coating 108 is deposited over at least portions of the first coating 130. The protective coating 108 can be a deposition of a polymer material, such as $C_4F_8$ or SiN as discussed previously with FIG. 3E. In other embodiments, the protective coating 108 can be deposited using a molded process.

Figure 4E:
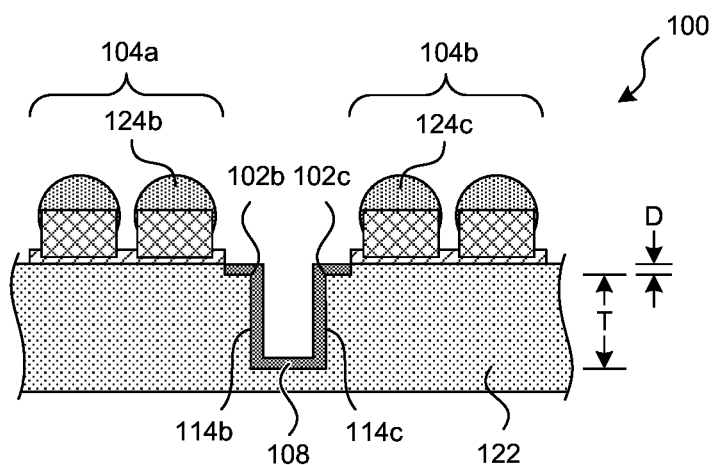
FIG. 4E shows a cross-sectional view the semiconductor die assembly of FIG. 4D with the protective coating adhered to the die corners and sidewalls of the dies before separation in accordance with the present technology.

FIG. 4E is a cross-sectional view of the semiconductor die assembly 100 after the first coating 130 has been removed in accordance with the present technology. The first coating 130 can be removed with a solution that does not dissolve or otherwise remove the protective coating 108. Wherever the protective coating 108 is on the first coating 130, such as the bumps 124, the protective coating 108 is also removed. This selective dissolving of the first coating 130 is expected to leave the portion of the protective coating 108 on the die corners 102 and the sidewalls 114 adhered to the silicon or other material of the die wafer 122.

Figure 4F:
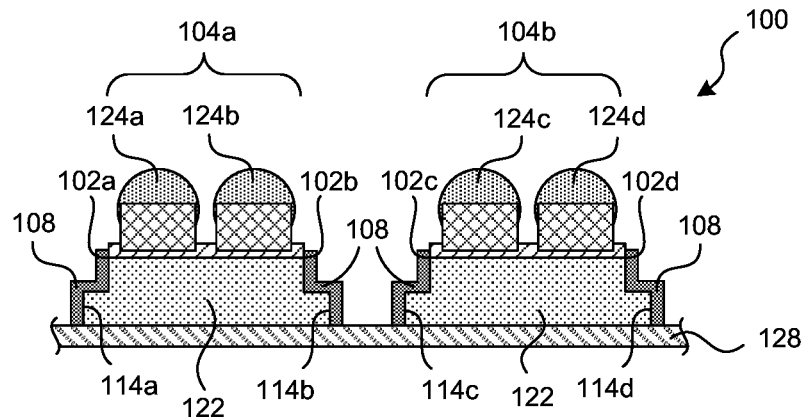
FIG. 4F shows a cross-sectional view of the semiconductor die assembly of FIG. 4E after the die wafer is thinned and has been mounted to a device wafer in accordance with the present technology.

FIG. 4F is a cross-sectional view of the semiconductor die assembly 100 after the die wafer 122 is thinned in accordance with the present technology. For example, the bumps 124 and/or surface 126 of the die wafer 122 can be attached to tape or a carrier film (not shown) to secure the die assembly 100 during wafer thinning (e.g., back-grinding). In some embodiments, the die wafer 122 can be thinned to be equal to or slightly less than the thickness "T" (FIG. 4E) such that the thinning separates the adjacent dies 104. After thinning, the die assembly 100 can be attached to the device wafer 128. Additionally, the die wafer 122 can be processed using laser marking at this step.

The protective coating 108 remains adhered to the die corners 102 to prevent cracking of the die corners 102 and delamination of the layers of the dies 104. The protective coating 108 remains adhered to the sidewalls 114 of the channels 112 to prevent damage that may occur during back-grinding (e.g., dust and debris) and/or movement/transportation of the dies 104 during the manufacturing process. For example, applying the protective coating 108 to the sidewalls 114 can help protect against delamination associated with metal layers of the die wafer 122 (e.g., the active layer of the die 104 and inter-layers of the die 104).

In other embodiments, the protective coating 108 may be applied more than once. For example, it may be desirable to remove less material at a time when exposing the sidewalls 114, such as in FIG. 4C. Therefore, one or more intermediate steps may be accomplished such that two or more layers of the protective coating 108 can be applied between iterative steps of etching or dicing. After the desired thickness of the die wafer 122 is achieved, the first coating 130 can be removed.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. Reference herein to "one embodiment," "some embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

From the foregoing, it will be appreciated that specific embodiments of the present technology have been described herein for purposes of illustration, but that various modifications may be made without deviating from the scope of the invention. The present technology is not limited except as by the appended claims.

I claim:

1. A method for separating semiconductor dies of a semiconductor die assembly, comprising:
   depositing a first coating on a first surface of a semiconductor die assembly that comprises a die wafer having a plurality of semiconductor dies, the die wafer having the first surface and a second surface;
   removing a portion of the first coating and first portion of the die wafer between adjacent semiconductor dies to form trenches having an intermediate depth in the die wafer between the first and second surfaces such that die corners of adjacent semiconductor dies are formed on either side of the trenches;
   depositing a protective coating on the first surface of the die assembly, the protective coating covering the die corners, the trenches and at least a portion of the first coating;
   selectively removing the first coating such that portions of the protective coating covering the die corners and the trenches remain on the die wafer; and
   separating adjacent semiconductor dies from each other such that the protective coating remains covering the die corners.

2. The method of claim 1, wherein the first coating comprises a water-soluble material, the method further comprising removing the first coating after the protective coating is deposited.

3. The method of claim 2, wherein the protective coating comprises a polymer material that adheres to the die corners and remains attached to the die corners after the first coating has been removed.

4. The method of claim 1, further comprising removing a second portion of the die wafer between adjacent semiconductor dies to form channels extending from the trenches through at least a portion of the die wafer between the adjacent semiconductor dies before depositing the protective coating.

5. The method of claim 4, wherein the depositing the protective coating further comprises depositing the protective coating on sidewalls of the channels.

6. The method of claim 4, wherein the first and second portions are removed using a plasma dicing process.

7. The method of claim 6, wherein both the depositing the protective coating and the plasma dicing process occur in a same chamber.

8. The method of claim 1, further comprising backgrinding the die wafer before depositing the first coating or after depositing the protective coating.

9. The method of claim 1, wherein the depositing the protective coating comprises molding a material on the outer surface of the die assembly.

10. The method of claim 1, wherein the protective coating comprises carbonfluorine ($C_4F_8$) or silicon nitride (SiN).

11. The method of claim 1, wherein the removing the first portion of the die wafer comprises laser grooving.

12. A method for separating semiconductor dies of a semiconductor die assembly, comprising:
   applying a mask over an outer surface of a semiconductor die assembly comprising a die wafer having a plurality of semiconductor dies;
   removing a first portion of the die wafer and corresponding portions of the mask to form trenches extending to an intermediate depth within the die wafer and die corners on adjacent semiconductor dies on opposing sides of the trenches;
   removing a second portion of the die wafer between the die corners to form channels having sidewalls within a width of the trenches;
   depositing a protective coating over at least the die corners and the sidewalls; and
   removing the mask and the protective coating deposited over the mask.

13. The method of claim 12, wherein removing the first and second portions comprises a plasma dicing process.

14. The method of claim 12, wherein the mask comprises a water-soluble material.

15. The method of claim 12, wherein the protective coating comprises a polymer material.

16. The method of claim 12, wherein the protective coating comprises carbonfluorine ($C_4F_8$) or silicon nitride (SiN).

* * * * *